(12) United States Patent
Wu

(10) Patent No.: US 7,863,759 B2
(45) Date of Patent: Jan. 4, 2011

(54) PACKAGE STRUCTURE AND METHOD FOR CHIP WITH TWO ARRAYS OF BONDING PADS ON BGA SUBSTRATE FOR PREVENTING GOLD BONDING WIRES FROM COLLAPSE

(75) Inventor: Ming-Feng Wu, Kaohsiung Hsien (TW)

(73) Assignee: Integrated Circuit Solution Inc., Shin-Chu (TW)

( * ) Notice: Subject to any disclaimer, the term of this patent is extended or adjusted under 35 U.S.C. 154(b) by 320 days.

(21) Appl. No.: 12/007,361

(22) Filed: Jan. 9, 2008

(65) Prior Publication Data
US 2008/0185720 A1    Aug. 7, 2008

(30) Foreign Application Priority Data
Feb. 2, 2007    (TW)    .............................. 96103968 A

(51) Int. Cl.
*H01L 23/48* (2006.01)

(52) U.S. Cl. ..................... 257/784; 257/667; 257/781; 257/E23.025; 257/E21.512; 438/118; 438/127; 438/128

(58) Field of Classification Search ................................. 257/E23.001–E23.194, 666–733, 777–786, 257/E23.025, E21.512, 784, 667; 438/66, 438/118, 127, 128
See application file for complete search history.

(56) References Cited

U.S. PATENT DOCUMENTS

| 6,215,182 | B1 * | 4/2001 | Ozawa et al. | ............... 257/723 |
| 6,531,784 | B1 | 3/2003 | Shim et al. | |
| 6,650,015 | B2 * | 11/2003 | Chen et al. | ................... 257/738 |

FOREIGN PATENT DOCUMENTS

CN            1591839A  A       3/2005

* cited by examiner

*Primary Examiner*—Jasmine J Clark
(74) *Attorney, Agent, or Firm*—Birch, Stewart, Kolasch & Birch, LLP

(57) ABSTRACT

A package structure and method for preventing gold bonding wires from collapsing are disclosed. The structure is especially useful for those chips whose two n×1 arrays of bonding pads are on the chip center to be packaged on a BGA substrate. According to the first preferred embodiment, two dies having a redistribution layer formed thereon are introduced outer the bonding pad array on the chip so that the gold bonding wires can be divided into two sections each to connect the bonding pads with the redistribution layer and the redistribution layer with the gold fingers on the BGA substrate. According to the second embodiment, the gold bonding wires are fixed by the epoxy strips on the chips after bonding the bonding pads to the gold fingers but before pouring liquid encapsulated epoxy into a mold.

5 Claims, 2 Drawing Sheets

PACKAGE STRUCTURE AND METHOD FOR CHIP WITH TWO ARRAYS OF BONDING PADS ON BGA SUBSTRATE FOR PREVENTING GOLD BONDING WIRES FROM COLLAPSE

BACKGROUND OF THE INVENTION (1) Field of the Invention

The invention relates to a package structure and method for preventing gold bonding wires from collapsing, which is especially useful for those chips whose arrays of bonding pads are on the chip center to be packaged on a ball grid array (BGA) substrate.

(2) Description of the Prior Art

In order to meet higher and higher density integrated circuit on a chip, the number of I/O pad must increase synchronously. The pad pitch is smaller than that in the past due to limited area, so that it is more difficult to use the conventional packaging technology. Therefore, manufacturers of package must find new ways of doing things from old packaging technology for the requirements of customers. Even so, the manufacturers still face a lot of difficulties, for example, the gold bonding wire is excessively long if a BGA is fabricated on the chip which has arrays of bonding pads on the chip center.

Referring to FIG. 1A and FIG. 1B, a solder ball 5 is disposed under the BGA substrate 10. The BGA substrate 10 is coated with a film of epoxy 15. Subsequently, a chip 20, which has two arrays of bonding pads 25 on the chip center, is adhered to the BGA substrate 10 with the epoxy 15. Finally, gold bonding wires 35 are bonded on the arrays of bonding pads 25 on the chip center and are also bonded on gold fingers 40 of the BGA substrate 10. As the front view, the bonding wire 35 is excessively long for connecting the bonding pads 25 to the gold finger 40. For example, it is available that the maximum length of wire bond is 140 mil (one-thousandth of an inch) on the chip with 10.526 mm L1×4.984 mm W1 and total length is 190 mil. However, the length of gold bonding wire gets up to 198 mil on the die, and total gets up to 218 mil if using above packaging process. When the chip is poured liquid encapsulated epoxy into a mold, it assumes the risk of reducing yield. Particularly, when the pad pitch is too dense, e.g. 50-100 μm, the wire collapsing happens to lead to short because the gold bonding wire is extruded by the liquid encapsulated epoxy. FIG. 1A shows that pad pitch is 90 μm, and the interval between two arrays of bonding pads is 0.425 mm. The typically defective rate is 50% to 80%.

FIG. 2 is a WBGA (Window BGA) package. The BGA substrate 10 has a window on its center. The chip 20 is connected to bonding pad 25 and to gold finger 40 of BGA substrate with gold bonding wire 35 by Flip-Chip package. Although it can reduce the length of gold bonding wire 35, the cost is increased. Another disadvantage is that WBGA is not suited to some package specifications.

The object of the invention is to provide a technology about the dummy wafer redistribution layer to reduce cost of package.

SUMMARY OF THE INVENTION

The invention discloses a package structure and method which includes bonding pads on the chip center to be packaged on a BGA substrate. The structure includes a BGA substrate, a chip whose bottom is adhered to the BGA substrate by insulating sealant. The BGA chip has two arrays of bonding pads on upper surface. Two dummy dies are respectively connected to the upper surface of the BGA chip with another insulating sealant. On upper surface of the dummy dies is formed RDL layers one to one corresponding to the bonding pads.

Two groups of the first gold bonding wires are respectively connected the first and second arrays of bonding pads to one end of the redistribution layer of two dummy dies. The other end of the redistribution layer is connected to the gold finger of BGA substrate by two groups of the second gold bonding wires.

According to the second embodiment, the package structure includes die, BGA substrate and gold bonding wires connecting the bonding pads to gold fingers, but excludes dummy dies. The gold bonding wires are fixed by the epoxy strips on the chips. Finally, the process of pouring liquid encapsulated epoxy is performed.

DESCRIPTION OF THE PREFERRED EMBODIMENTS

As above, the conventional package technology has problems of collapsing of excessively long gold bonding wire when there are the specific bonding pads to be located on the center of chip. If using WBGA package, it is possible to cause higher cost or is not well suited to some chips. The invention can solve above problems.

Figure 1:
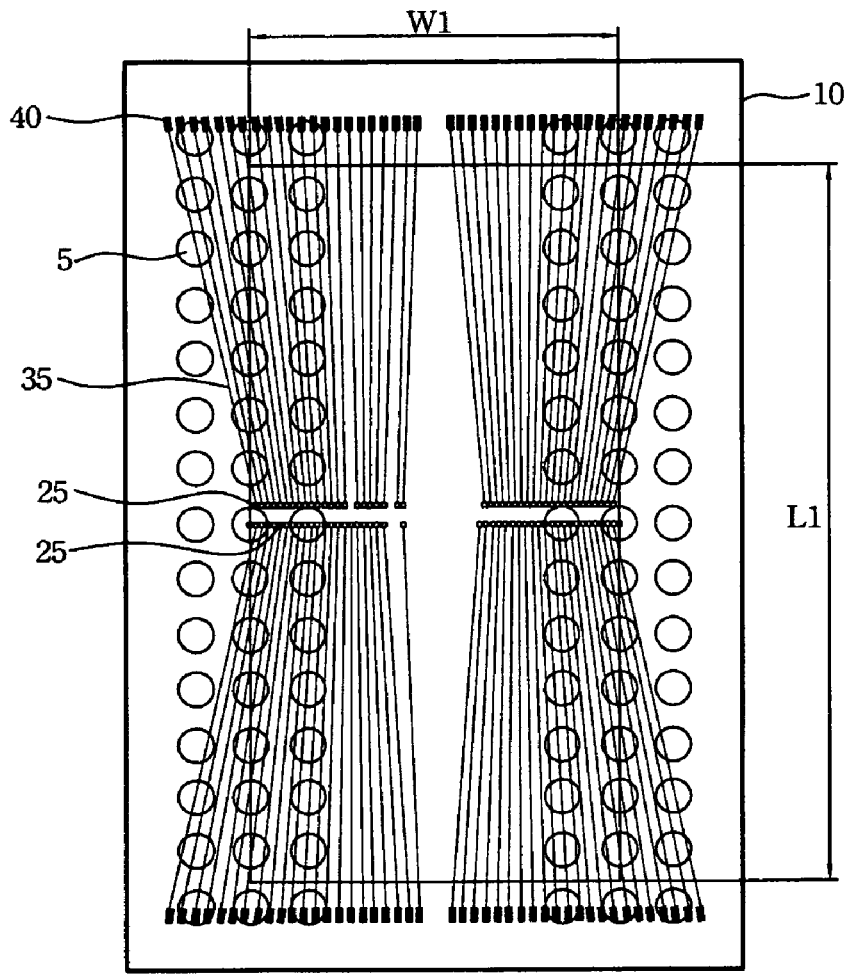
FIG. 1A is a top view of package structure whose two arrays of bonding pads are on the chip center to be packaged on a BGA substrate.
FIG. 1B is a front view of package structure whose gold bonding wire has length exceeding the packaging standard.
Figure 1:
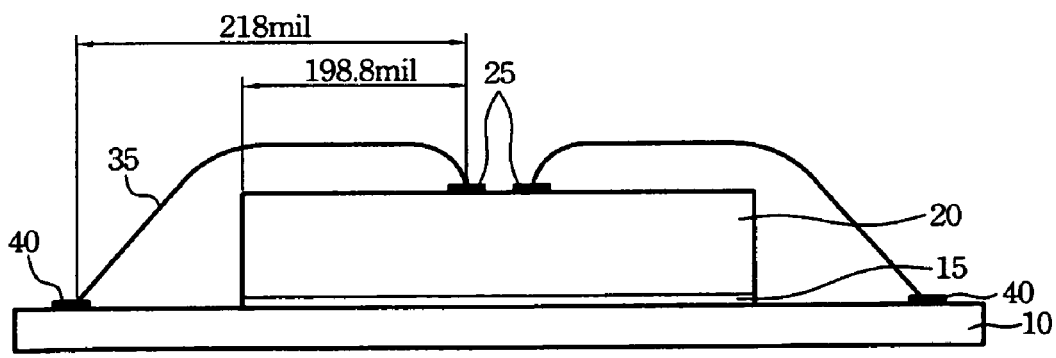
Figure 2:
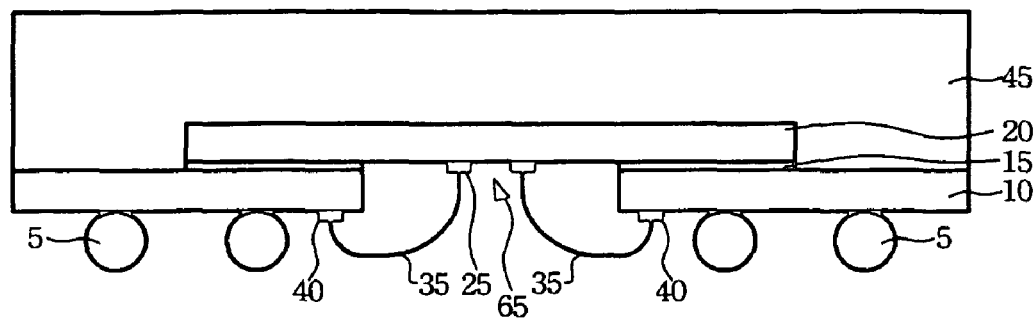
FIG. 2 is a front view of package structure whose chip is flip-chip packaged on the BGA substrate with a window.
Figure 3:
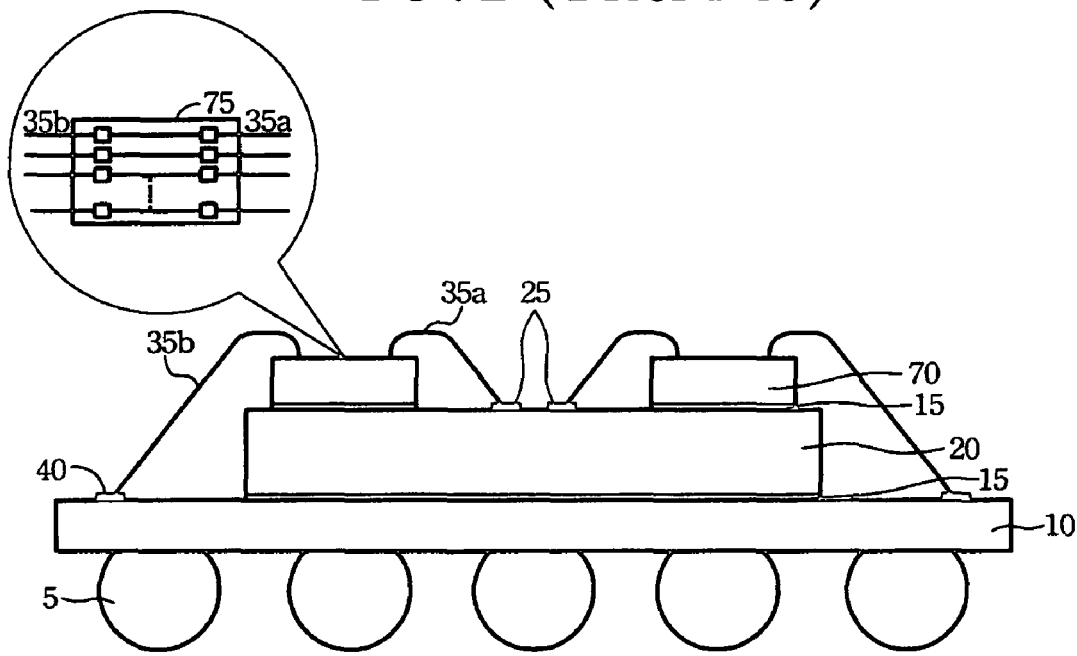
FIG. 3 is a first preferred embodiment of the invention which overcomes the collapsing of excessively long gold bonding wire by dummy die to connect in sections.

The first embodiment of the invention is to reduce the length of gold bonding wires by stacked chips, referring to FIG. 3. The structure of FIG. 3 includes a BGA chip 20 to be packaged. The BGA chip 20 has two lines of bonding pads 25 on the chip center, and is applied by insulating epoxy 15 outside the two lines of bonding pads 25. Two dummy dies 70 are respectively covered on the insulating epoxy 15. Note that only RDL layer 75 is formed on the dummy dies 70 to correspond to the bonding pads 25.

Redistribution layer (RDL) 75 can be formed on the silicon wafer by semiconductor process such as depositing oxidizing layer, depositing metal layer, lithography and etching etc., and then be cut to form the dummy dies.

Referring to FIG. 3, the bonding pad 25 is connected to the RDL layer 75 on dummy die 70 through the first segment of gold bonding wire 35a. The second segment of gold bonding wire 35b connects the RDL layer 75 to the gold finger 40 of the BGA substrate 10.

According to the first embodiment, the invention overcomes the problem of excessively long gold bonding wires, and reduces the defective rate to below 0.5%.

Figure 4:
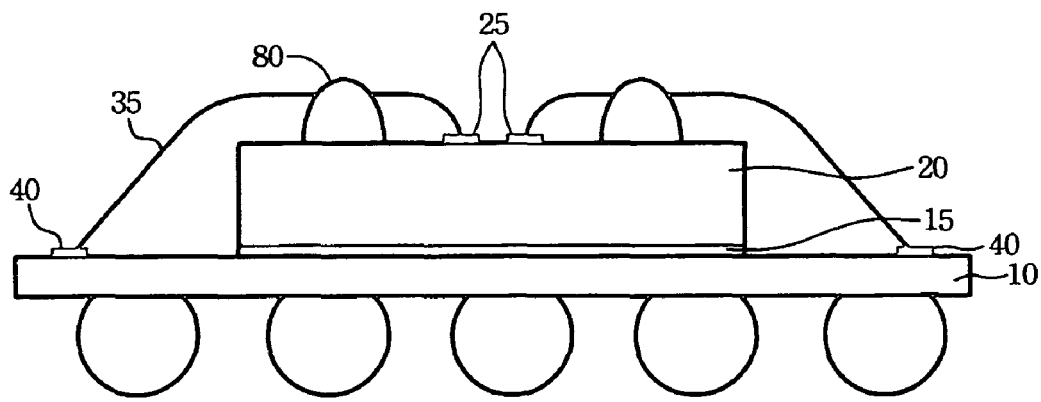
FIG. 4 is a second preferred embodiment of the invention which uses epoxy strips to fix the excessively long gold bonding wire on the chip to reduce the defect resulted from the collapsing.

Besides, the embodiment shown as FIG. 4 can be also employed to solve the problem of excessively long gold bonding wires. The chip 20 and the BGA substrate 10 shown as FIG. 4 are about the same as that shown as FIG. 3. The difference is that the gold bonding wires 35 are fixed by the epoxy strips 80 on the chips after bonding the bonding pads 40 to the gold fingers 25 but before pouring liquid encapsulated epoxy into a mold. The process can reduce defective rate to below 20%.

The advantages of the invention are as follows.

1. The yield is up and cost is down because the problem of excessively long gold bonding wires has been solved.

2. The silicon die is an example of dummy die in the invention, but it is not limited the invention. The dummy die can be replaced with print circuit board, or other semiconductor chip etc. on condition that it is easy to gain the RDL layer and low cost.

While the preferred embodiments of the present invention have been set forth for the purpose of disclosure, modifications of the disclosed embodiments of the present invention as well as other embodiments thereof may occur to those skilled in the art. Accordingly, the appended claims are intended to cover all embodiments which do not depart from the spirit and scope of the present invention.

What is claimed is:

1. A package structure for preventing gold bonding wires from collapsing, which is especially useful for those chips whose bonding pads are on the chip center to be packaged on a BGA substrate, the package structure comprising:
   a BGA substrate;
   a BGA chip whose bottom is connected to the BGA substrate by an insulating sealant, and the BGA chip having at least two arrays of bonding pads;
   two dummy dies connecting to an upper surface of the chip, the upper surface of the dummy dies having redistribution layers which corresponds to the bonding pads;
   two first gold bonding wires respectively connecting from the bonding pads in a first and a second arrays to one end of the redistribution layers of the two dummy dies, and the redistribution layers having the other end connecting to gold fingers on the upper surface of the BGA substrate by two second gold bonding wires.

2. The package structure of claim 1, wherein the dummy die is a silicon substrate on which is formed with an oxidizing layer and a metal layer.

3. The package structure of claim 1, wherein the insulating sealant is epoxy.

4. The package structure of claim 1, wherein the distance between each array of bonding pads is about 50-90 μm.

5. A method of package of a BGA substrate having two rows of gold fingers formed thereon and a BGA chip whose two rows of bonding pads are on the BGA chip center adhered amid for preventing gold bonding wires from collapsing during a process of pouring liquid encapsulated epoxy into a mold, wherein the gold bonding wires are outward connected the two rows of the bonding pads to the two rows of the gold fingers, respectively, wherein the improvement comprises:
   two epoxy strips disposed on the gold bonding wires to fix said gold bonding wires on the BGA chip at a predetermined distance outward from the two rows of the pads before pouring the liquid encapsulated epoxy into the mold.

* * * * *